United States Patent
Takeuchi et al.

(10) Patent No.: US 6,194,809 B1
(45) Date of Patent: Feb. 27, 2001

(54) SURFACE ACOUSTIC WAVE DEVICE COMPRISING LANGASITE SINGLE CRYSTAL SUBSTRATE

(75) Inventors: Masao Takeuchi, Machida; Mitsuhiro Tanaka, Aichi Pref., both of (JP)

(73) Assignees: NGK Insulators, Ltd., Nagoya; Masao Takeuchi, Machida, both of (JP)

( * ) Notice: Subject to any disclaimer, the term of this patent is extended or adjusted under 35 U.S.C. 154(b) by 0 days.

(21) Appl. No.: 09/401,406

(22) Filed: Sep. 22, 1999

(30) Foreign Application Priority Data

Sep. 22, 1998 (JP) .................................. 10-268520

(51) Int. Cl.[7] ............................. H03H 9/25; H03H 9/145
(52) U.S. Cl. .................................. 310/313 R; 310/313 B
(58) Field of Search ............................ 310/313 R, 313 A, 310/313 B, 358

(56) References Cited

U.S. PATENT DOCUMENTS

| | | | |
|---|---|---|---|
| 5,682,126 | * 10/1997 | Plesski et al. | 333/193 |
| 5,773,911 | * 6/1998 | Tanaka et al. | 310/313 B |
| 5,838,091 | * 11/1998 | Watanabe | 310/131 C |
| 5,917,265 | * 6/1999 | Naumenko et al. | 310/313 A |
| 5,977,846 | * 11/1999 | Kajihara et al. | 333/196 |
| 6,005,325 | * 12/1999 | Inoue et al. | 310/313 A |

FOREIGN PATENT DOCUMENTS

| | | | |
|---|---|---|---|
| 0 865 156 A2 | 9/1998 | (EP) | H03H/9/02 |
| 8-97672 | 4/1996 | (JP) | H03H/9/25 |
| 8-125484 | 5/1996 | (JP) | H03H/9/145 |
| 8-204492 | 8/1996 | (JP) | H03H/9/145 |
| 9-135142 | 5/1997 | (JP) | H03H/9/145 |

OTHER PUBLICATIONS

Inoue et al., "Propagation Characteristics of Surface Acoustic Waves on Langasite", 1998 Publication Board, Japanese Journal of Applied Physics, vol. 37, Part 1, No. 5B, May 1998, pp. 2909–2913.

* cited by examiner

Primary Examiner—Thomas M. Dougherty
(74) Attorney, Agent, or Firm—Parkhurst & Wendel, L.L.P.

(57) ABSTRACT

A surface acoustic wave device including a substrate and an electrode structure formed on the substrate, said substrate being made of a doubly rotated Y-cut ($\alpha X$–$\theta Y$ cut) Langasite ($La_3Ga_5SiO_{14}$), a rotation angle $\alpha$ from the X axis being substantially $50°\pm5°$ and a rotation angle $\theta$ from the Y axis being substantially $19°$–$30°$. The device further includes a normal type electrode structure which reveals a natural single-phase unidirectional transducer property together with an anisotropy of the substrate. The device further has a double electrode type electrode structure which cancels the directionality, or a floating type electrode structure which reverses the directionality. The electrode structure is formed to constitute a surface acoustic wave filter having a low insertion loss and an excellent phase property.

8 Claims, 6 Drawing Sheets

SURFACE ACOUSTIC WAVE DEVICE COMPRISING LANGASITE SINGLE CRYSTAL SUBSTRATE

BACKGROUND OF THE INVENTION

1. Field of the Invention

The present invention relates to a surface acoustic wave device such as surface acoustic wave (SAW) filter, surface acoustic wave resonator and surface acoustic wave guide, and more particularly relates to a surface acoustic filter with low loss utilizing a natural single-phase unidirectional transducer (NSPUDT) property.

2. Description of the Related Art

Heretofore, surface acoustic wave devices have been desired to have large electro-mechanical coupling coefficient $K^2$, small power flow angle PFA, small temperature coefficient of delay time TCD and so on. Furthermore, recent electronic devices are required to be small in size, light in weight and economical in power consumption.

There has been widely used a transversal type surface acoustic wave filter including a substrate having a piezoelectric property, a transmitter side transducer having interdigitally arranged positive and negative electrode fingers, which are connected to two opposite phase output terminals of a single-phase signal source, and a receiver side transducer having interdigitally arranged positive and negative electrode fingers. Such a transversal type surface acoustic wave filter has been used for extracting a desired signal component within a given frequency range.

In such a surface acoustic wave filter, it has been required to reduce an insertion loss and to suppress undesired ripple components within a given frequency range. Since usual interdigital type electrode structures have a bidirectional property, the insertion loss could not be reduced smaller than a theoretical insertion loss of 6 dB. This insertion loss of 6 dB is too large to realize a SAW filter having a desired property.

In order to mitigate such a drawback, there has been proposed a multi-transducer system, in which on both sides of each of a plurality of transmitter side transducers, there is arranged a pair of receiver side transducers. In a surface acoustic wave filter of such a multi-transducer system, it is possible to reduce the insertion loss to about 1.5–2.0 dB. However, in the multi-transducer system, the control of a plurality of transducers is very difficult and good phase and frequency properties could not be attained. Moreover, it is quite difficult to manufacture such a multi-transducer system device. In order to improve the performance of the surface acoustic wave device, it is also very important to flatten a phase characteristic, to suppress pass band ripples and to reduce a suppression band.

In order to meet the above mentioned requirements, it has been proposed to use a unidirectional transducer that can realize a very small insertion loss which is theoretically lower than 1 dB and has excellent phase and frequency characteristics. There have been proposed various types of the unidirectional transducers. They may be roughly classified into:

(a) multi-phase type unidirectional transducer, and (b) single-phase type unidirectional transducer.

As the latter single-phase type unidirectional transducer, there have been proposed various types. For instance, there has been proposed a single-phase unidirectional transducer utilizing an asymmetry of electrode structure and an internal reflection due to the mass load effect, a reflection bank type unidirectional transducer having a reflection bank between exiting electrodes, a single-phase unidirectional transducer utilizing a reflection by floating electrodes, and a natural single-phase unidirectional transducer utilizing anisotropic property of a substrate. In surface acoustic wave devices including these unidirectional transducers, the directionality is realized by making an exciting wave and a reflected wave to be in-phase in a wave propagating direction and to be in opposite phase in an opposite direction.

Heretofore, substrates of surface acoustic wave devices are made of single crystals of quartz, lithium tantalate ($LiTaO_3$) and lithium niobate ($LiNbO_3$). In U.S. Pat. No. 5,698,927, there is proposed the use of lithium tetraborate ($LiB_4O_7$) single crystal as a substrate revealing the natural single-phase unidirectional transducer operation. However, the known single crystals are not optimal for the surface acoustic wave device, and it is particularly difficult to obtain a surface acoustic wave filter having desired characteristics.

For instance, in order to realize a surface acoustic wave resonator, it is required that the electro-mechanical coupling coefficient $K^2$ be large, the reflection be large, the power flow angle PFA be small and the temperature coefficient of delay time TCD be small. However, the electro-mechanical coupling coefficient $K^2$ of quartz is about 0.2 and the reflection of quartz is small. Therefore, it is rather difficult to realize a surface acoustic wave resonator having desired characteristics by using the quartz substrate.

A substrate for the surface acoustic wave filter is required to have a large electro-mechanical coupling coefficient $K^2$, a small reflection, a small power flow angle PFA and a small temperature coefficient of delay time TCD. However, the use of a piezoelectric substrate having such characteristics has not been proposed.

In the above mentioned known single-phase unidirectional transducer, except for the natural single-phase unidirectional transducer, the electrode structure has become very complicated. Particularly, the distance between adjacent electrode edges and the width of an electrode have to be smaller than $\lambda/4$. Upon increasing the operation frequency, the distance and width should be much smaller, and it is quite difficult to manufacture electrodes of such small distance and width.

In order to mitigate the above mentioned drawbacks, there has been proposed a natural single-phase unidirectional transducer (NSPUDT), in which the unidirectionality is realized by utilizing the anisotropy of the piezoelectric substrate although the normal type electrode structure having an electrode edge distance of $\lambda/4$ and an electrode width of $\lambda/4$ is used. It is known that quartz substrate, $LiNbO_3$ substrate and $LiTaO_3$ substrate, show the NSPUDT operation due to anisotropy. However, in these known piezoelectric substrates, the electro-mechanical coupling coefficient $K^2$ is small, the temperature coefficient of delay time TCD is not zero, the power flow angle PFA is not zero, and a directionality reversed electrode structure could not be realized easily. Due to these problems, it is very difficult to realize an ideal surface acoustic wave device.

Furthermore, in order to obtain a surface acoustic wave device which is small in size, light in weight and low in electric power consumption, it is advantageous to decrease the propagating velocity of a surface acoustic wave. However, the above-mentioned piezoelectric substrates have a relatively high propagating velocity which is not lower than 3000 m/sec. Therefore, the known piezoelectric substrates cannot produce a surface acoustic wave device which is small in size, light in weight and low in electric power consumption.

Recently, a piezoelectric substrate made of Langasite ($La_3Ga_5SiO_{14}$) single crystal has been proposed for the surface acoustic wave device. It has been reported that the Langasite single crystal belongs to the trigonal system to which the quartz crystal also belongs, and has a higher electro-chemical coupling coefficient $K^2$ and a higher phase transition temperature than the quartz crystal ("The $17^{th}$ ULTRASONIC SYMPOSIUM Preliminary Theses", page 305, 1996). In the same publication, page 306, there is also described that in an X-cut Langasite single crystal, the temperature dependency becomes almost zero when a rotation angle $\theta$ from the Y axis is set to a value within a range of 10°–20°. Further, in "1996 IEEE INTERNATIONAL FREQUENCY CONTROL SYMPOSIUM, FILTER AND RESONATOR USING LANGASITE", pp. 379–382, 1996, it has been reported that a Langasite single crystal is used as a substrate for a bulk resonator. It should be noted that the bulk resonator is quite different from the surface acoustic wave device. Moreover, in "Japan Journal of Applied Physics", Vol. 37, part 1, No. 5B, page 2909, 1998 as well as in "$27^{th}$ EM SYMPOSIUM Preliminary Theses", 1998, page 125, it has been reported that a doubly rotated Y-cut ($\alpha X-\theta Y$ cut) Langasite single crystal substrate having a rotation angle $\alpha$ from the X axis of 50° and a rotation angle $\theta$ from the Y axis of 22.5°–24° has a superior temperature property which is compatible with the ST-X cut quartz crystal substrate.

As stated above, several reports have been issued about the velocity of the surface acoustic wave, electro-mechanical coupling coefficient $K^2$ and temperature dependency for the Langasite single crystal substrates. However, no one has reported the electrode reflection property. Particularly, the above publications do not mention at all that the Langasite single crystal has the unidirectionality due to the anisotropy, i.e. NSPUDT property.

The inventors have reported in "Lecture Theses of The Acoustical Society of Japan", 1–8–22, page 997, 1997 that the Langasite single crystal substrate can be advantageously used for surface acoustic wave devices. In this publication, it is reported that the doubly rotated Y-cut Langasite single crystal substrate having a rotation angle $\alpha=0°-30°$ and a rotation angle $\theta=0°-20°$, shows a good NSPUDT property. After various experiments and analyses, the inventors have found that the power flow angle PFA of such a Langasite single crystal substrate is not zero, and therefore this known Langasite single crystal substrate could not produce a surface acoustic wave device having an optimal performance.

SUMMARY OF THE INVENTION

The present invention has for its object to provide a novel and useful surface acoustic wave device, which can remove or at least mitigate the above-mentioned drawbacks of the known surface acoustic wave devices, and which can be constructed as a surface acoustic wave resonator and a surface acoustic wave filter having a superior or excellent property.

According to a first aspect of the invention, a surface acoustic wave device comprises:

a substrate made of a single crystal of doubly rotated Y-cut ($\alpha Y-\theta X$ cut) Langasite ($La_3Ga_5SiO_{14}$) and having a surface, a rotation angle $\alpha$ from the Y axis being substantially 50°±5° and a rotation angle $\theta$ from the X axis being substantially 19°–+°;

a first electrode structure formed on said surface of the substrate such that a natural single-phase unidirectional transducer property is revealed together with an anisotropy of the substrate; and a second electrode structure formed on said surface of the substrate such that the natural single-phase unidirectional transducer property due to the anisotropy of the substrate is cancelled.

According to a second aspect of the invention, a surface acoustic wave device comprises:

a substrate made of a single crystal of doubly rotated Y-cut ($\alpha Y-\theta X$ cut) Langasite ($La_3Ga_5SiO_{14}$) and having a surface, a rotation angle $\alpha$ from the Y axis being substantially 50°±5° and a rotation angle $\theta$ from the X axis being substantially 19°–30°;

a first electrode structure formed on said surface of the substrate such that a natural single-phase unidirectional transducer property is revealed together with an anisotropy of the substrate; and a second electrode structure formed on said surface of the substrate such that a directionality of the natural single-phase unidirectional transducer property due to the anisotropy of the substrate is reversed.

In the surface acoustic wave device according to the first and second aspects of the invention, said the first electrode structure for revealing the natural single-phase unidirectional transducer property together with the anisotropy of the substrate may be advantageously formed by a normal type electrode structure, in which positive and negative electrode fingers, each having a width of about $\lambda/4$ are interdigitally aligned with an edge distance of about $\lambda/4$.

Furthermore, the second electrode structure for canceling the natural single-phase unidirectional transducer property, due to the anisotropy of the substrate according to the first aspect of the invention, may be formed by a double electrode type electrode structure, in which pairs of positive electrode fingers, and pairs of negative electrode fingers each having a width of substantially $\lambda/8$ are interdigitally aligned with an edge distance of about $\lambda/8$.

The second electrode structure for reversing a directionality of the natural single-phase unidirectional transducer property due to the anisotropy of the substrate according to the second aspect of the invention may be formed by a floating type direction-reversed electrode structure, in which positive and negative electrode fingers each having a width of about $\lambda/8$ are alternately aligned with a pitch of substantially $\lambda/2$ and floating electrodes having a width of about $\lambda/4$ are inserted between successive positive and negative electrode fingers with an edge distance of substantially $\lambda/16$.

It should be noted that the first and second electrode structures, according to the first and second aspects of the invention, may be formed by other electrode structures which have the directionality canceling faculty or the directionality reversing faculty.

The doubly rotated Y-cut Langasite substrate having the anisotropy revealing the natural single-phase unidirectional transducer (NSPUDT) property, according to the invention, has large electro-mechanical coupling coefficient $K^2$, large reflection, small temperature coefficient of delay time TCD and particularly small power flow angle PFA. Moreover, the first electrode structure is formed to reveal the NSPUDT property together with the anisotropy of the substrate, and thus a surface acoustic wave filter having a very small insertion loss can be realized.

It has been, experimentally confirmed that the NSPUDT property can be obtained for the doubly rotated Y-cut Langasite single crystal, which is cut such that the rotation angle $\alpha$ from the Y axis is set to about 50°±5° and the rotation angle $\theta$ from the X axis is set to about 19°–30°. However, there is a possibility that the NSPUDT property may be revealed for cut angles outside said ranges.

The inventors have conducted a theoretical analysis for the surface acoustic wave of a Rayleigh wave type. To this end, the Cambell & Jones method has been utilized, which is widely used for calculating a phase velocity of surface acoustic wave and electric potential. Furthermore, the reflectivity of strip electrodes and NSPUDT revealing cut angles have been sought by using a combination of two theories, one being the mode coupling theory which reflects the perturbation effect as a primary effect upon the analysis for the operation of an interdigital transducer (IDT), and the other being the perturbation theory by means of which, mode coupling parameters such as particle velocity of surface acoustic wave, electric potential, material of strip electrode and dependency upon the electrode structure may be expressed as a closed equation. Moreover, material constants of the Langasite single crystal have been referred to those reported by Kaminskii, Silvestrova and others. As a result of such a theoretical analysis, it has been confirmed that the Langasite single crystal can be used as the particularly superior substrate of the surface acoustic wave device.

DESCRIPTION OF THE PREFERRED EMBODIMENT

In the following explanation, a propagating direction of surface acoustic wave on a substrate is denoted as $X_1$ axis, a direction normal to a surface of the substrate is expressed as $X_3$, and the cutting orientation of substrate and propagating direction are represented by the right hand Euler angle notation ($\Psi$, $\mu$, $\theta$). In the coupling of mode theory (COM), among the four main parameters in a mode coupling equation, i.e., self-coupling coefficient $\kappa_{11}$, mutual coupling coefficient $\kappa_{12}$, transduction coefficient $\zeta$ and electrostatic capacitance per unit length C, the mutual coupling coefficient $\kappa_{12}$ is directly related to the electrode reflection. The mutual coupling coefficient $\kappa_{12}$ is the most important parameter for revealing the NSPUDT property which positively utilizes the anisotropy of the substrate and the reflection by the strip electrodes. In a conventional bidirectional interdigital transducer IDT, the mutual coupling coefficient $\kappa_{12}$ is a real number, but in the NSPUDT and SPUIDT which utilizes the asymmetry in the construction, the mutual coupling coefficient $\kappa_{12}$ becomes a complex number.

By the first order perturbation theory, the mutual coupling coefficient $\kappa_{12}$ normalized by a wavelength $\lambda$ of a surface acoustic wave may be represented as follows:

$$\kappa_{12}\lambda = |\kappa_{12}|\lambda e^{2j\phi_0} = K_E + K_M \lambda/h e^{2j\phi_M} \quad (1)$$

Here, h is a thickness of electrode film, the first term $K_E$ on the right denotes the electric perturbation of electrode, and the second term on the right represents the elastic perturbation.

Between the mutual coupling coefficient $\kappa_{12}$ and the reflection coefficient of electrode per unit wavelength, there is established the following relationship:

$$r_+ = -j\kappa_{12}^*\lambda, \quad r_- = -j\kappa_{12}\lambda \quad (2)$$

Here, * denotes a complex conjugate symbol, and $r_+$ and $r_-$ represent the reflection coefficients viewed in $+X_1$ and $-X_1$ directions, respectively. It should be noted that in the NSPUDT substrate, $r_+ \neq r_-$.

Now a phase condition for attaining an optimum NSPUDT operation may be given by the following equation.

$$\arg(\kappa_{12}\lambda) = \pm 90°, \quad (\phi_0 = \pm 45°) \quad (3)$$

Figure 1:
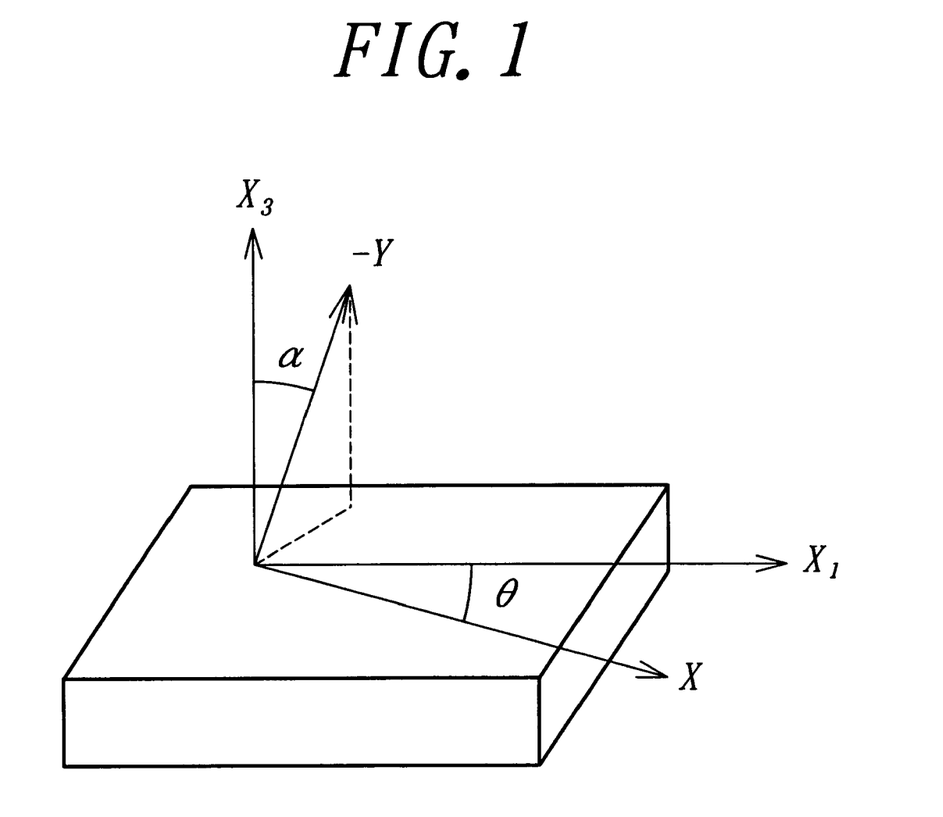
FIG. 1 is a schematic view explaining the cut angle of the doubly rotated Y-cut Langasite single crystal of the surface acoustic wave device according to the invention.

Here, a positive sign is applied when the forward direction is identical with the direction $+X_1$ in FIG. 1 and a negative sign is used when the forward direction is $-X_1$.

When it can be assumed that the electrode has a sufficiently large thickness and the electric perturbation term can be ignored, a phase angle $2\phi_0$ of the mutual coupling coefficient $\kappa_{12}$ is determined by a phase angle $2\phi_M$ of the elastic perturbation term. Therefore, it can be understood that an optimum NSPUDT operation can be attained for $\phi_M = \pm 45°$.

The inventors have calculated values for the surface acoustic wave velocity $V_R$, electro-mechanical coupling coefficient $K^2$ and $K_E$, $K_M$ and $\phi_M$ in the equation (1) for the strip electrode having $\lambda/4$. Now a result of this calculation will be shown.

Figure 2A:
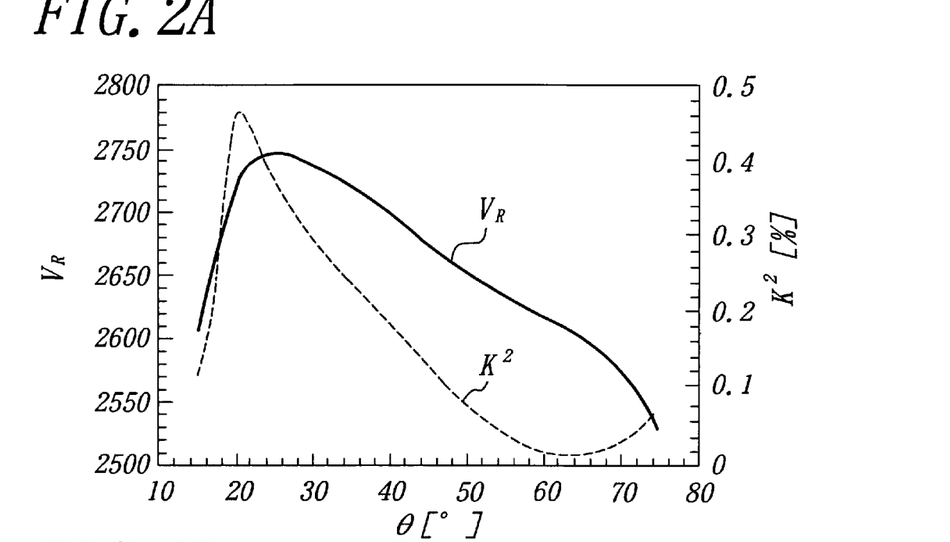
FIGS. 2A–2C are graphs showing the dependency of various characteristics of the substrate shown in FIG. 1 upon the cut angle $\theta$.
Figure 2B:
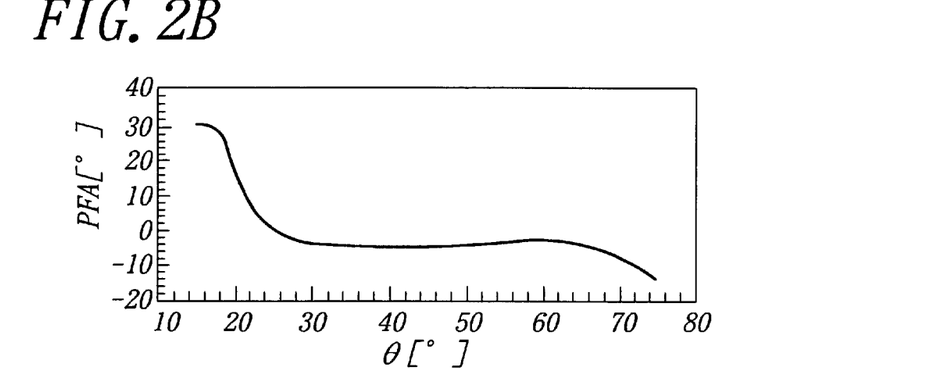
Figure 2C:
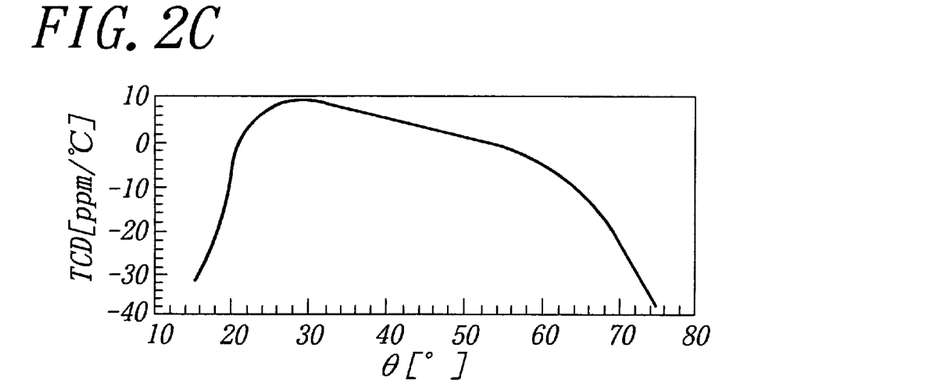

FIG. 1 illustrates a doubly rotated Y-cut Langasite single crystal which may be obtained by rotating the propagating direction $X_1$ of a surface acoustic wave in the ($\alpha$-rotated Y-cut Langasite single crystal from the X axis by an angle $\theta$, and FIGS. 2A–2C show various characteristics of such a Langasite single crystal. It should be noted that the Langasite single crystal substrate may be expressed in the Euler angle notation (0°, 140°, $\theta$).

FIG. 2A shows the acoustic velocity $V_R$ and electro-mechanical coupling coefficient $K^2$, FIG. 2B represents the power flow angle PFA, and FIG. 2C denotes the temperature coefficient of delay time TCD. According to the invention, the Langasite single crystal substrate is formed such that ($\alpha \cong 50° \pm 5°$ and $\theta \cong 19°$–$30°$. Now this will be explained in detail.

The lower limit of the rotation angle $\theta$ from the X axis is set to about 19°. As can be seen from FIG. 2A, the electro-mechanical coupling coefficient $K^2$ has a peak near $\theta = 20°$, and is rapidly decreased in accordance with an increase in $\theta$. Furthermore, as illustrated in FIG. 2B, the power flow angle PFA is suddenly decreased from $\theta = 18°$, and as depicted in FIG. 2C, the temperature coefficient of delay time TCD becomes smaller than $-10$ ppm/° C. In this connection, it should be noted TCD is preferably restricted within a range of $\pm 10$ ppm/° C.

According to the invention, the upper limit of the rotation angle $\theta$ is set to about 30°. This is due to the fact that when $\theta$ exceeds this upper limit, the electro-mechanical coupling coefficient $K^2$ becomes smaller than 0.3% as shown in FIG. 2A.

According to the invention, the rotation angle (α from the Y axis is restricted to about 50°±5°. The characteristics shown in FIGS. 2A–2C are obtained for α=50°, and it is assumed that similar characteristics could be obtained even if the rotation angle α deviates from 50° by an amount of ±10% thereof.

As explained above, according to the invention, the doubly rotated Y-cut Langasite single crystal can have a very high electro-mechanical coupling coefficient $K^2$ as shown in FIG. 2A, which is larger than that of the known quartz substrate by a factor of more than two. Furthermore, the power flow angle PFA is very small and is in the range of 0°–20° as shown in FIG. 2B. The temperature coefficient of delay time TCD is very small and is in the range of ±10 ppm/° C., as depicted in FIG. 2C. Therefore, the doubly rotated Y-cut Langasite single crystal according to the invention has excellent characteristics for the substrate of the surface acoustic wave device.

The Langasite single crystal substrate according to the invention has the electro-mechanical coupling coefficient $K^2$ of 0.39–0.46, which is much larger than that of the known ST-X cut quartz. Further, the propagating velocity $V_R$ is 2700–2750 m/s, which is lower than that of the known value. Therefore, the doubly rotated single crystal substrate according to the invention can be used to make a small and light surface acoustic wave device having a lower power consumption.

When an aluminum electrode is provided on the doubly rotated Y-cut Langasite single crystal substrate, the propagating velocity $V_R$ underneath the aluminum electrode becomes extremely lower than that at the remaining portion of the substrate. However, when a gold electrode is provided on the Langasite single crystal substrate, the propagating velocity is substantially identical to the remaining portion. By utilizing such characteristics it is possible to make a superior surface acoustic wave guide. In other words, since the surface acoustic wave is liable to concentrate at a portion having a lower propagating velocity, by providing an aluminum electrode only at a periphery, a surface acoustic wave guide having small transmission loss and dispersion may be attained.

Figure 3:
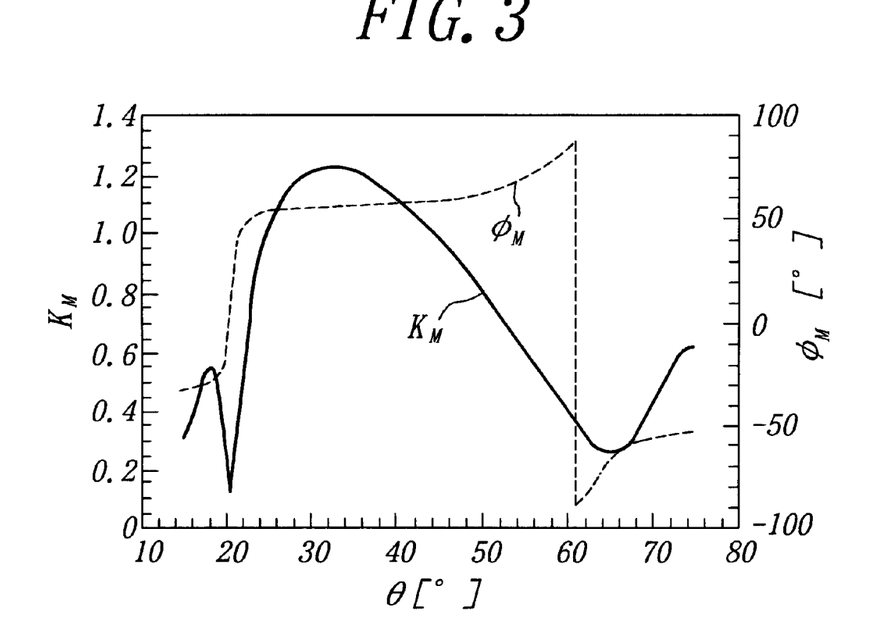
FIG. 3 is a graph representing various characteristics of the Langasite single crystal used in the surface acoustic wave device according to the invention.

FIG. 3 is a graph showing the calculated results of $K_M$ and $\phi_M$ of the elastic perturbation expressed by $K_M(h/\lambda)\exp(2j\phi_M)$. As can be seen from FIG. 3, in the range of θ of about 19°–30°, $\phi_M$ is about 50°–53° which is close to $\phi=45°$ at which the optimum NSPUDT property can be attained. Furthermore, the value of $K_M$ is larger than that of the quartz substrate which is cut to reveal the NSPUDT property, and it is expected that the sufficient directionality could be obtained even by using a relatively thin strip electrode.

Figure 4:
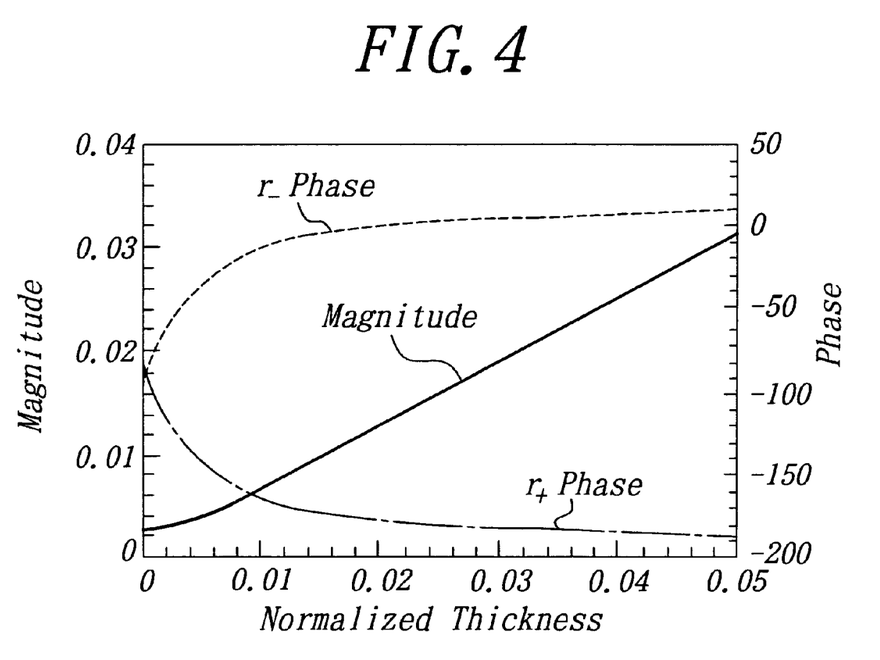
FIG. 4 is a graph showing the magnitude and phase of a reflection coefficient of a strip electrode formed on the Langasite single crystal substrate according to the invention.

FIG. 4 is a graph illustrating the magnitude and phase of a reflection coefficient of the strip electrode formed on the Langasite single crystal substrate of (0°, 140°, 22.5°). These values are calculated in accordance with equation (2) and the electrode thickness is normalized. In the bidirectional substrate, $r_+=r_-$, $\angle r_+=\angle r_-=\pm 90°$, whereas the reflection coefficient of the Langasite substrate having the above-mentioned cut angle differs therefrom very much. Therefore, in designing the surface acoustic wave device, special care must be taken.

Next, the transduction characteristic of the doubly rotated Y-cut Langasite single crystal substrate, revealing the NSPUDT operation according to the invention will be explained.

Figure 5:
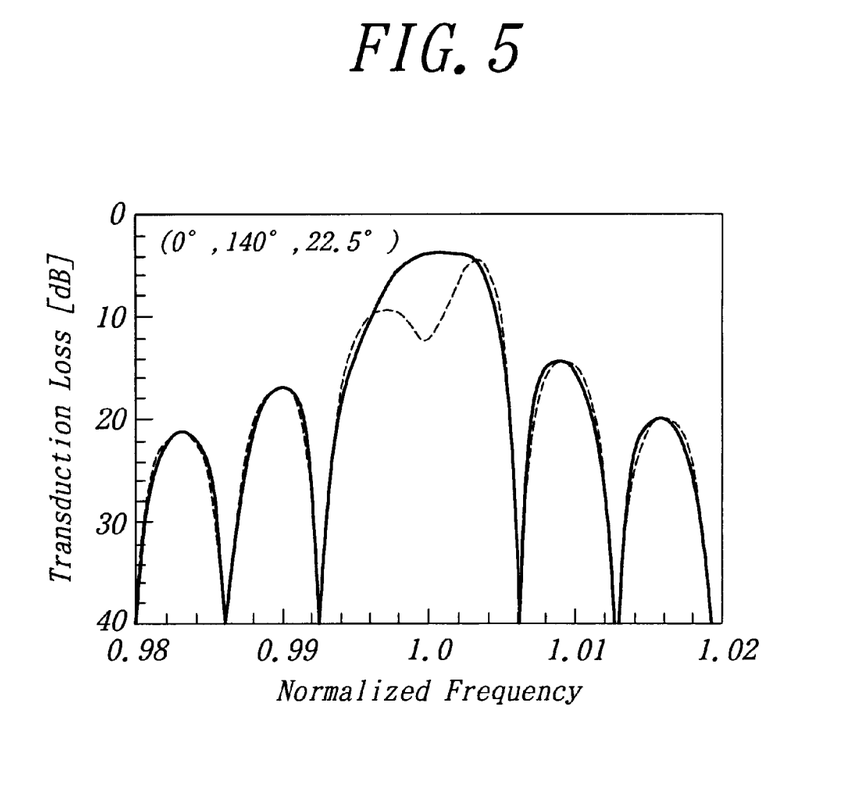
FIG. 5 is a graph denoting the conversion loss of the doubly rotated Y-cut Langasite single crystal substrate for use in the surface acoustic wave device according to the invention.

FIG. 5 is a graph representing the transduction loss of the NSPUDT having 150 pairs of normal type electrode and an aperture length of 100λ, in which the doubly rotated Y-cut Langasite single crystal substrate of (0°, 140°, 22.5°) is used, and aluminum electrodes are formed such that a ratio of a thickness h to a wavelength λ (h/λ) is 0.01. In FIG. 5, a solid line indicates the transduction loss in the $-X_1$ direction and a broken line denotes the transduction loss in the $+X_1$ direction. Near the center frequency, a difference in the transduction loss between the $-X_1$ direction and $+X_1$ direction is very large, which shows the superior unidirectionality, i.e. NSPUDT property.

As explained above, the doubly rotated Y-cut Langasite single crystal substrate, according to the invention, shows a superior unidirectional property, and when the surface acoustic wave filter is formed from such a substrate, the electrode structure is important. In other words, in the NSPUDT substrate, when the input and output transducers are formed by the same electrode structure, the insertion loss becomes large, because the forward direction of the transmitter side transducer is not opposite to the forward direction of the receiver side transducer. In order to mitigate such a drawback, it is necessary to reverse or cancel the directionality of one of the transducers. Such a directionality reversing or canceling electrode structure may be formed by known directionality reversing electrode structures disclosed in Japanese Patent Application Laid-open Publications Kokai Hei 8-97672, 8-125484, 8-204492 and 9-135142 as well as in U.S. Pat. No. 5,698,927 and EP 0704967A2.

Figure 6:
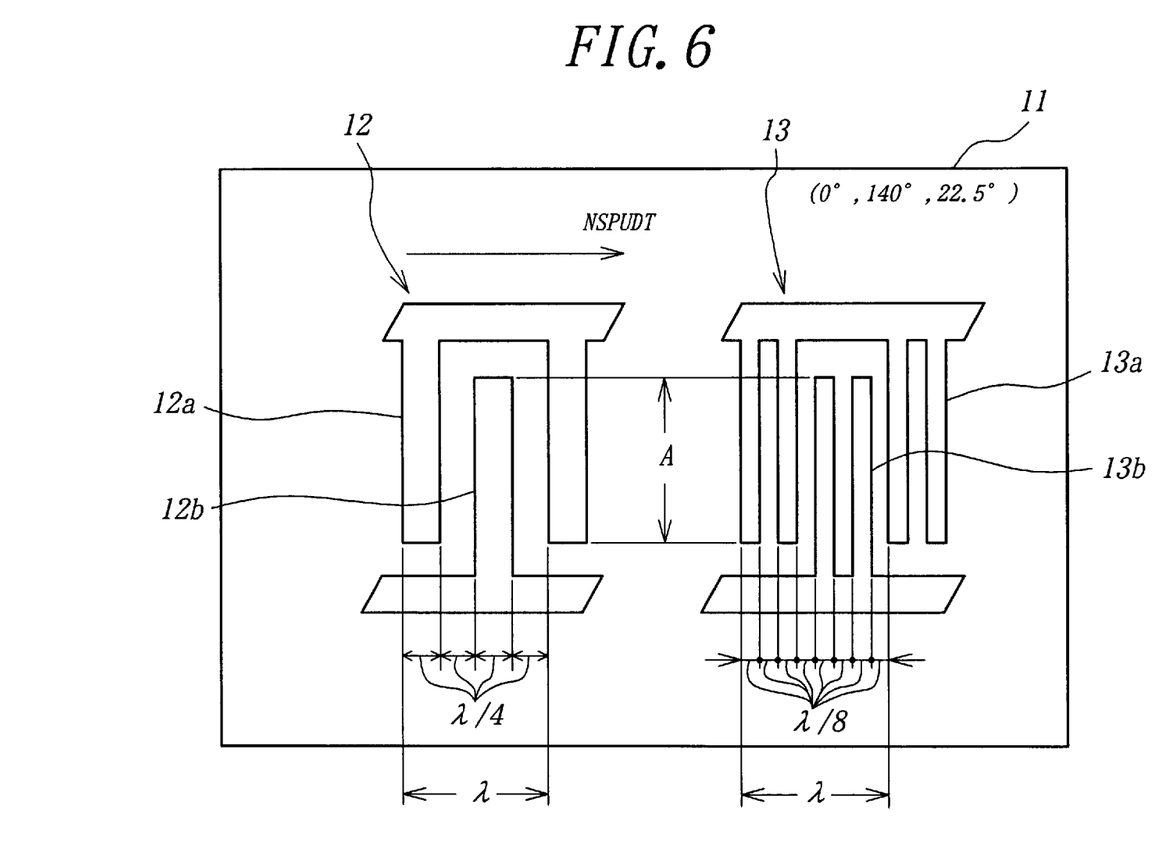
FIG. 6 is a schematic plan view illustrating an embodiment of the surface acoustic wave filter according to the invention.

FIG. 6 is a schematic plan view showing an embodiment of the surface acoustic wave device of the invention constructed as the surface acoustic wave filter. In the present embodiment, a substrate 11 is made of a doubly rotated Y-cut Langasite single crystal of (0°, 140°, 22.5°). A transmitter side transducer 12 is formed by a normal type interdigital electrode structure having positive and negative interdigital electrode fingers 12a and 12b each having a width of λ/4 and an edge distance of λ/4. In combination of this normal type interdigital electrode structure with the Langasite single crystal substrate 11, the NSPUDT operation is realized and the transmitter side transducer 12 has the directionality in $X_1$. The number of electrode finger pairs is fifty. An aperture length A is about 200 μm, said aperture length being defined as a length over which the positive and negative electrodes are overlapped with each other.

A receiver side transducer 13 comprises a double electrode type electrode structure, in which two positive electrode fingers 13a and two negative electrode fingers 13b are arranged alternately with an edge distance of λ/8, and each of the electrode fingers 13a, 13b has a width of λ/8. The number of electrode finger pairs is fifty. The electrodes of the transmitter and receiver side transducers 12 and 13 are made of aluminum and have the same thickness.

In this surface acoustic wave filter, the transmitter side transducer 12 formed by the normal type electrode structure has the directionality directing in $X_1$ inherent to the substrate, while the receiver side transducer 13 formed by the double electrode type electrode structure cancels the directionality and reveals the bi-directionality. Therefore, the surface acoustic wave filter has superior transduction property.

Figure 7:
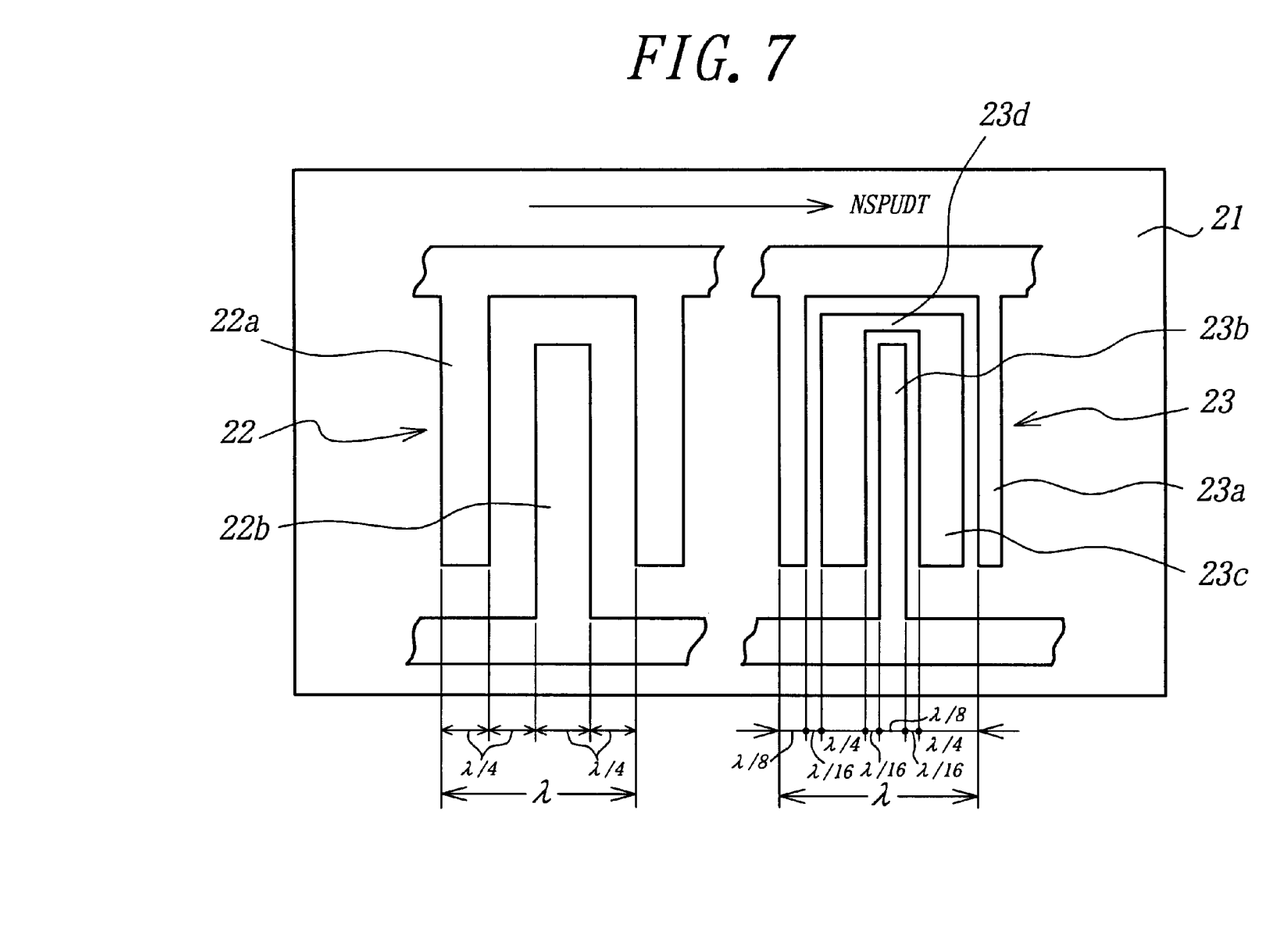
FIG. 7 is a schematic plan view showing another embodiment of the surface acoustic wave device according to the invention constructed as the surface acoustic wave filter.

FIG. 7 is a schematic plan view showing another embodiment of the surface acoustic wave filter according to the invention. In the present embodiment also, a substrate 21 is made of a doubly rotated Y-cut Langasite single crystal of (0°, 140°, 22.5°), and a transmitter side transducer 22 is formed by the normal type interdigital electrode structure having positive and negative interdigital electrode fingers 22a and 22b each having a width of λ/4 and an edge distance of λ/4. A receiver side transducer 23 is formed by a floating type electrode structure comprising positive and negative interdigital electrode fingers 23a and 23b each having a width of λ/8, and floating electrodes 23c having a width of about λ/4. The positive and negative electrode fingers 23a and 23b and floating electrodes are arranged with an edge distance of λ/16. In each segment, the floating electrodes 23c are connected to each other by a bridging member 23d. All of the electrode fingers are made of aluminum and have the same thickness. The number of electrode finger pairs is fifty and an aperture length A is about 200 μm. This floating type electrode structure of the receiver side transducer 23 reverses the directionality of the substrate 21 and reveals the reversed directionality which is opposite to the direction $X_1$. In other words, in the present embodiment, the transmitter side transducer 22 has the directionality in $X_1$ and the receiver side transducer 23 has the directionality in $-X_1$, and therefore, the surface acoustic wave filter has a particularly small insertion loss.

As described above, according to the invention, by using the doubly rotated Y-cut Langasite single crystal with the rotation angle α from the Y axis of about 50°±5° and the rotation angle θ from the X axis of about 19°–30° as the substrate of the surface acoustic wave device, it is possible to realize the surface acoustic wave device having the large electro-mechanical coupling coefficient $K^2$, small power flow angle PFA, and small temperature coefficient of delay time TCD, while the natural single-phase unidirectional transducer property due to the anisotropy of the substrate is revealed, and therefore the insertion loss is small and the excellent phase property can be obtained. In any device, the propagating velocity of the surface acoustic wave is lower than conventional substrates, it is possible to obtain the small and light surface acoustic wave device having a lower electric power consumption. Furthermore, since the propagating velocity of surface acoustic wave is low, when electrodes are made of aluminum, it is possible to realize the surface acoustic wave guide in which the propagation loss and dispersion can be reduced and an undesired decrease in the center frequency can be avoided.

What is claimed is:

1. A surface acoustic wave device, comprising:
    a substrate made of a single crystal of doubly rotated Y-cut (αY–θX cut) Langasite ($La_3Ga_5SiO_{14}$) and having a surface, said α being substantially 50°±5° and said θ being substantially 19°–30°;
    a first electrode structure formed on said surface of the substrate such that a natural single-phase unidirectional transducer property is revealed together with an anisotropic property of the substrate; and
    a second electrode structure formed on said surface of the substrate such that the natural single-phase unidirectional transducer property due to the anisotropy of the substrate is cancelled.

2. A surface acoustic wave device as claimed in claim 1, wherein said first electrode structure comprises a normal type interdigital electrode structure, wherein positive and negative electrode fingers each having a width of λ/4 are interdigitally aligned at a distance of λ/4 from each other.

3. A surface acoustic wave device as claimed in claim 1, wherein said second electrode structure comprises a double type interdigital electrode structure, wherein pairs of positive electrode fingers and pairs of negative electrode fingers each having a width of λ/8 are interdigitally aligned at a distance of λ/8 from each other.

4. A surface acoustic wave device as claimed in claim 3, wherein said first and second electrode structures are made of aluminum and have a same thickness.

5. A surface acoustic wave device comprising:
    a substrate made of a single crystal of doubly rotated Y-cut (αX–θY cut) Langasite ($La_3Ga_5SiO_{14}$) and having a surface, said α being substantially 50°±5° and said θ being substantially 19°–30°;
    a first electrode structure formed on said surface of the substrate such that a natural single-phase unidirectional transducer property is revealed with the aid of an anisotropic property of the substrate; and
    a second electrode structure formed on said surface of the substrate such that a directionality of the natural single-phase unidirectional transducer property due to the anisotropy of the substrate is reversed.

6. A surface acoustic wave device as claimed in claim 5, wherein said first electrode structure comprises a normal type interdigital electrode structure, wherein positive and negative electrode fingers each having a width of λ/4 are interdigitally aligned at a distance of λ/4 from each other.

7. A surface acoustic wave device as claimed in claim 5, wherein said second electrode structure comprises a floating type interdigital electrode structure, wherein positive and negative electrode fingers each having a width of λ/8 are alternately aligned with a pitch of about λ/2, and wherein floating electrodes each having a width of λ/4 are inserted between successive positive and negative electrode fingers with a distance of about λ/16 from an adjacent positive or negative electrode.

8. A surface acoustic wave device as claimed in claim 5, wherein said first and second electrode structures are made of aluminum and have a same thickness.

* * * * *